(12) United States Patent
Alshinnawi et al.

(10) Patent No.: US 9,520,043 B1
(45) Date of Patent: Dec. 13, 2016

(54) IDENTIFYING AN OUTLET OF A POWER DISTRIBUTION UNIT BASED ON A POWER RATING OF AN ELECTRONIC DEVICE

(71) Applicant: Lenovo Enterprise Solutions (Singapore) Pte. Ltd., Singapore (SG)

(72) Inventors: Shareef F. Alshinnawi, Apex, NC (US); Gary D. Cudak, Wake Forest, NC (US); Edward S. Suffern, Durham, NC (US); J. Mark Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/742,255

(22) Filed: Jun. 17, 2015

(51) Int. Cl.
| | |
|---|---|
| *G08B 21/18* | (2006.01) |
| *G06F 13/40* | (2006.01) |
| *G06F 13/42* | (2006.01) |
| *G06K 7/10* | (2006.01) |
| *H05K 7/14* | (2006.01) |
| *G06F 1/26* | (2006.01) |

(52) U.S. Cl.
CPC ......... *G08B 21/182* (2013.01); *G06F 13/4068* (2013.01); *G06F 13/4282* (2013.01); *G06K 7/10237* (2013.01); *G06F 1/266* (2013.01); *H05K 7/1498* (2013.01)

(58) Field of Classification Search
CPC ....... G01R 19/155; G01R 15/14; G01R 29/12; G01R 19/16538; G05B 15/02; G05B 2219/2642; H02J 13/001; H02J 13/0048; H02J 3/14; H02J 2003/007; G06F 1/266; H05K 7/1498

See application file for complete search history.

(56) References Cited

U.S. PATENT DOCUMENTS

| | | | |
|---|---|---|---|
| 6,415,978 B1 * | 7/2002 | McAllister | G06K 7/0004 235/462.01 |
| 7,391,299 B2 * | 6/2008 | Bender | G06Q 10/06 340/292 |
| 8,000,074 B2 * | 8/2011 | Jones | G06K 19/07758 361/93.1 |
| 8,471,415 B1 * | 6/2013 | Heninwolf | H01R 13/6683 307/125 |
| 9,059,590 B2 * | 6/2015 | Cassidy | H02J 7/00 |

(Continued)

*Primary Examiner* — Joseph Feild
*Assistant Examiner* — Rufus Point
(74) *Attorney, Agent, or Firm* — Katherine S. Brown; Jeffrey L. Streets (57) ABSTRACT

A system includes an electronic device including a baseboard management controller (BMC), a power supply unit (PSU), and an external connector, wherein the BMC controls a serial communication bus, and the external connector includes AC voltage contacts and serial communication bus contacts. A power distribution unit (PDU) includes multiple outlets, a management entity, a radio frequency identification (RFID) tag reader, and a visual indicator. A power cable includes a first plug end for coupling to the external connector, a second plug end for coupling to one of the outlets, AC voltage wires extending end-to-end, a read/write RFID tag in the second plug end, and communication wires extending from the first plug end to the read/write RFID tag. Coupling the first plug end to the external connector connects the AC voltage and connects the serial communication bus such that the BMC is in serial communication with the read/write RFID tag.

11 Claims, 4 Drawing Sheets

(56) References Cited

U.S. PATENT DOCUMENTS

| | | | | |
|---|---|---|---|---|
| 2005/0114718 A1* | 5/2005 | Ito | G06F 13/409 | 713/300 |
| 2006/0072271 A1* | 4/2006 | Jones | G06K 19/07758 | 361/93.1 |
| 2007/0050271 A1* | 3/2007 | Ufford | G06Q 10/087 | 705/28 |
| 2007/0055470 A1* | 3/2007 | Pietrzyk | G05B 19/05 | 702/104 |
| 2007/0149013 A1* | 6/2007 | Eastham | H01R 13/7036 | 439/140 |
| 2008/0094201 A1* | 4/2008 | Paradiso | G06K 19/0723 | 340/505 |
| 2009/0262382 A1* | 10/2009 | Nobutani | H04L 12/10 | 358/1.15 |
| 2011/0153112 A1* | 6/2011 | Vander Hout | G07C 3/00 | 700/297 |
| 2011/0274437 A1* | 11/2011 | Jones | G02B 6/3895 | 398/141 |
| 2011/0291813 A1* | 12/2011 | Jansma | G06F 1/266 | 340/10.5 |
| 2013/0119777 A1* | 5/2013 | Rees | H01F 38/14 | 307/104 |
| 2014/0159483 A1* | 6/2014 | Robertazzi | H02J 3/26 | 307/14 |

\* cited by examiner

IDENTIFYING AN OUTLET OF A POWER DISTRIBUTION UNIT BASED ON A POWER RATING OF AN ELECTRONIC DEVICE

BACKGROUND

Field of the Invention

The present invention relates to distributing power to a plurality of electronic devices without tripping a circuit breaker.

Background of the Related Art

A large computing system may consume a large amount of electrical power. The various components responsible for supplying the power to each entity in the computing cluster are referred to collectively as a power distribution system. The power distribution system may be specifically designed for the demands of a particular computing system. It is important to avoid overloading an electrical phase, a circuit breaker, or a power distribution unit.

While the original design and installation of a complex computing system may adequately account for proper loading of the power distribution system, the loading of the power distribution system may be altered over time as servers, switches, storage devices and other electronic devices are added, removed, replaced and reconfigured. The power distribution infrastructure, such as the circuit breakers and power distribution units, will usually remain unchanged since the power distribution units typically have unused outlets. However, even with the availability of PDU outlets, there may not be sufficient power capacity in a given PDU or particular circuit on a PDU in order to power new or additional devices. Swapping out an old electronic device with a new higher power model can also change the dynamics and requirements of the power infrastructure without using any additional outlets.

BRIEF SUMMARY

One embodiment of the present invention provides a system comprising an electronic device including a baseboard management controller, a power supply unit, and an external connector, wherein the baseboard management controller controls a serial communication bus, and wherein the external connector includes first contacts connected for providing AC voltage to the power supply and second contacts providing communication with the serial communication bus. The system further comprises a power distribution unit including a plurality of outlets, a management entity, a radio frequency identification tag reader connected for providing input to the management entity, and at least one visual indicator controlled by the management entity. Still further, the system comprises a power cable including a first plug end for selectively coupling to the external connector of the electronic device, a second plug end for selectively coupling to one of the plurality of outlets of the power distribution unit, AC voltage wires extending from the first plug end to the second plug end, a read/write radio frequency identification tag in the second plug end, and communication wires extending from the first plug end to the read/write radio frequency identification tag. Coupling the first plug end to the external connector connects the AC voltage wires to the first contacts and connects the communication wires to the second contacts such that the baseboard management controller is in serial communication with the read/write radio frequency identification tag.

Another embodiment of the present invention provides a method comprising providing a power supply unit power rating to a read/write radio frequency identification tag of a power cable coupled to the power supply unit and a radio frequency identification tag reader of a power distribution unit wirelessly reading the power supply unit power rating from the read/write radio frequency identification tag prior to coupling the power cable to the power distribution unit. The method further comprises a management entity determining whether the power distribution unit has a sufficient power available to supply the power supply unit with an amount of power equal to the power supply unit power rating without exceeding a power distribution unit power rating.

DETAILED DESCRIPTION

One embodiment of the present invention provides a system comprising an electronic device including a baseboard management controller (BMC), a power supply unit (PSU), and an external connector, wherein the baseboard management controller controls a serial communication bus, and wherein the external connector includes first contacts connected for providing AC voltage to the power supply and second contacts providing communication with the serial communication bus. The system further comprises a power distribution unit (PDU) including a plurality of outlets, a management entity, a radio frequency identification (RFID) tag reader connected for providing input to the management entity, and at least one visual indicator controlled by the management entity. Still further, the system comprises a power cable including a first plug end for selectively coupling to the external connector of the electronic device (i.e., a PSU end of the power cable), a second plug end for selectively coupling to one of the plurality of outlets of the power distribution unit (i.e., a PDU end of the power cable), AC voltage wires extending from the first plug end to the second plug end, a read/write radio frequency identification tag in the second plug end, and communication wires extending from the first plug end to the read/write radio frequency identification tag. Coupling the first plug end to the external connector connects the AC voltage wires to the first contacts and connects the communication wires to the second contacts such that the baseboard management controller is in serial communication with the read/write radio frequency identification tag.

The electronic device may be any of a wide variety of electronically power devices including, without limitation, servers, multi-node chassis, network switches, and data storage devices. The power supply unit (PSU) converts AC voltage to DC voltage that is used by the electronic device. Since the electronic device cannot consume any greater amount of power than the one or more power supply units that provide power to the electronic device, the power rating(s) of the one or more power supply units represent the maximum amount of power or load that may be placed on the power distribution unit.

In a further embodiment, the power supply unit may store a power supply unit power rating and the management entity in the power distribution unit may store a power distribution unit power rating. The baseboard management controller may access and send the power supply unit power rating to the read/write radio frequency identification tag, such that the radio frequency identification tag reader may wirelessly read the power supply unit power rating from the read/write radio frequency identification tag. Optionally, each end of the power cable may contain a register for storing power rating data as it is transmitted and provided to the read/write radio frequency identification tag.

Still further, the management entity, such as an application specific integrated circuit (ASIC), may obtain a power supply unit power rating for each electronic device that is already receiving power from one of the outlets of the power distribution unit. It is then possible for the management entity to determine the maximum amount of power that may be drawn from the power distribution unit by the currently connected electronic devices and how much, if any, power is still available for an additional electronic device without exceeding the power distribution unit power rating. Accordingly, the management entity may control a visual indicator on the power distribution unit to indicate whether the power distribution unit power rating is greater than the sum of the power supply unit power ratings of each electronic device receiving power from one of the outlets and the power supply unit power rating read from the read/write radio frequency identification tag. Alternatively, the power distribution unit may include a plurality of visual indicators that are each positioned adjacent to one of the plurality of outlets, such that the management entity may control the plurality of visual indicators to identify one or more of the outlets where the second plug end may be coupled to provide the electronic device with power from the power distribution unit without the sum of the power supply unit power ratings of each electronic device receiving power from one of the outlets and the power supply unit power rating read from the read/write radio frequency identification tag exceeding the power distribution unit power rating.

In another embodiment, the plurality of outlets on the power distribution unit may include a first subset of at least two outlets supplying power from a first electrical phase, a second subset of at least two outlets supplying power from a second electrical phase, and a third subset of at least two outlets supplying power from a third electrical phase. In this instance, each subset of outlets may have its own power rating or maximum power limit to observe in accordance with the methods described herein. Optionally, the power distribution units may include a plurality of visual indicators, such that there is a visual indicator positioned adjacent to each of the plurality of outlets. The management entity may control the plurality of visual indicators to identify one or more of the outlets where the second plug end may be coupled to provide the electronic device with power from the power distribution unit while achieving a greater balance of total power supply unit power ratings among the first, second and third phases. Preferably, the management entity will also indicate whether the identified outlet can supply enough power to meet the power supply unit power rating without causing the phase from exceeding its power rating, which is functionally the same as a power distribution unit power rating.

In accordance with various embodiments, the baseboard management controller may be in communication with a cable detector for detecting that the first plug end of the power cable has been coupled to the external connector. Optionally, the baseboard management controller may then use the serial communication bus, such as inter-integrated circuit bus, to send the power supply unit power rating to the read/write radio frequency identification tag at the second plug end of the power cable.

Embodiments of the present invention enable the management entity of the power distribution unit to determine, prior to coupling a power cable from the electronic device to the power distribution unit, whether the power distribution unit can supply an electronic device with power to the full extent of its power supply unit power rating. Accordingly, the electronic device does not yet have access to AC voltage from the power distribution unit. In one option, the system may include a battery providing auxiliary power to the BMC prior to the electronic device receiving AC voltage from the power distribution unit. The battery may be a battery dedicated to providing the power supply unit power rating to the read/write radio frequency identification tag in accordance with the methods described herein. Alternatively, the battery may be a battery backup included in the power supply unit, such as an uninterruptible power supply. With either type of battery, it is possible to divide power usage within the BMC so that only those functions of the BMC related to providing the power rating to the RFID tag are powered by the battery. Full functionality of the BMC may be delayed until AC power has been applied to the PSU via the power cable. The function of the BMC related to providing the power rating to the RFID tag include reading the power rating from the PSU, detecting that a power cable has been connected to the electronic device, and writing the power rating into the RFID circuit in the cable.

Another embodiment of the present invention provides a method comprising providing a power supply unit power rating to a read/write radio frequency identification tag of a power cable coupled to the power supply unit and a radio frequency identification tag reader of a power distribution unit wirelessly reading the power supply unit power rating from the read/write radio frequency identification tag prior to coupling the power cable to the power distribution unit. The method further comprises a management entity determining whether the power distribution unit has a sufficient power available to supply the power supply unit with an amount of power equal to the power supply unit power rating without exceeding a power distribution unit power rating.

In various embodiments, the method may further comprise obtaining a power rating for each of a plurality of other power supply units already coupled to the power distribution unit, wherein the amount of power available is equal to the power distribution unit power rating less a sum of the power ratings for each of the plurality of other power supply units already coupled to the power distribution unit. In one option, the method may then energize a visual indicator adjacent to one of a plurality outlets in the power distribution unit that can supply an amount of power equal to or greater than the power rating of the electronic device. In another option, the method may supply power from a first electrical phase to a first subset of outlets in the power distribution unit, supply power from a second electrical phase to the second subset of outlets of outlets in the power distribution unit, supply power from a third electrical phase to the third subset of outlets of outlets in the power distribution unit, and energize a visual indicator adjacent to an outlet to which the power supply unit may be connected while achieving a greater balance of total power supply unit power ratings among the first, second and third phases.

In one non-limiting example, a PDU has six outlets and is able to supply six times 750 watts or 4500 watts of total power. However, if five servers are already connected to the PDU, with four servers each consuming 900 watts according to the Underwriter's Laboratories (UL) power rating and a fifth server consuming 750 watts. According to this example, only 150 watts of power remains to be supplied by the PDU before the PDU would exceed its PDU power rating of 4500 watts. If another 750 watt power supply of a sixth server were allowed to be connected to the PDU, the PDU circuit breaker would activate and the five powered servers would be powered off, thereby disrupting the normal server operation. Therefore, when the IT specialist tries to connect the cable, the PDU management entity uses an RFID reader to read the RFID tag in the PDU end of the power cable. Since the power rating indicated by the RFID tag is 750 watts, the current power consumption of 4350 watts would increase to 5100 watts if the server was connected to the PDU. However, since 5100 watts exceeds the PDU power rating of 4500 watts, a red LED adjacent to the available PDU outlet is illuminated indicating that this PDU outlet cannot be used to power this server. An outlet on another PDU needs to be found.

In a further embodiment, the method may further comprise detecting that a power cable has been inserted into the power supply unit of the electronic device, wherein the power supply unit power rating is provided to the read/write radio frequency identification tag in response to detecting that the power cable has been plugged into the power supply unit.

Optionally, the power supply unit power rating may be provided to a read/write radio frequency identification tag of the power cable coupled to the power supply unit by transmitting the power supply unit power rating over a serial communication bus that extends through the power cable to the read/write radio frequency identification tag. When the power cable is coupled to the external connector of the power supply unit, the serial communication bus is extended by virtue of contact between communication wires in the power cable and the existing serial communication bus controlled by the baseboard management controller.

Yet another embodiment of the invention provides a computer program product comprising a non-transitory computer readable storage medium having program instructions embodied therewith, the program instructions executable by a processor to cause the processor to perform a method. One such method comprises providing a power supply unit power rating to a read/write radio frequency identification tag of a power cable coupled to the power supply unit, a radio frequency identification tag reader of a power distribution unit wirelessly reading the power supply unit power rating from the read/write radio frequency identification tag prior to coupling the power cable to the power distribution unit, and a management entity determining whether the power distribution unit has a sufficient power available to supply the power supply unit with an amount of power equal to the power supply unit power rating without exceeding a power distribution unit power rating.

The foregoing computer program products may further include computer readable program code for implementing or initiating any one or more aspects of the methods described herein. Accordingly, a separate description of the methods will not be duplicated in the context of a computer program product.

Figure 1:
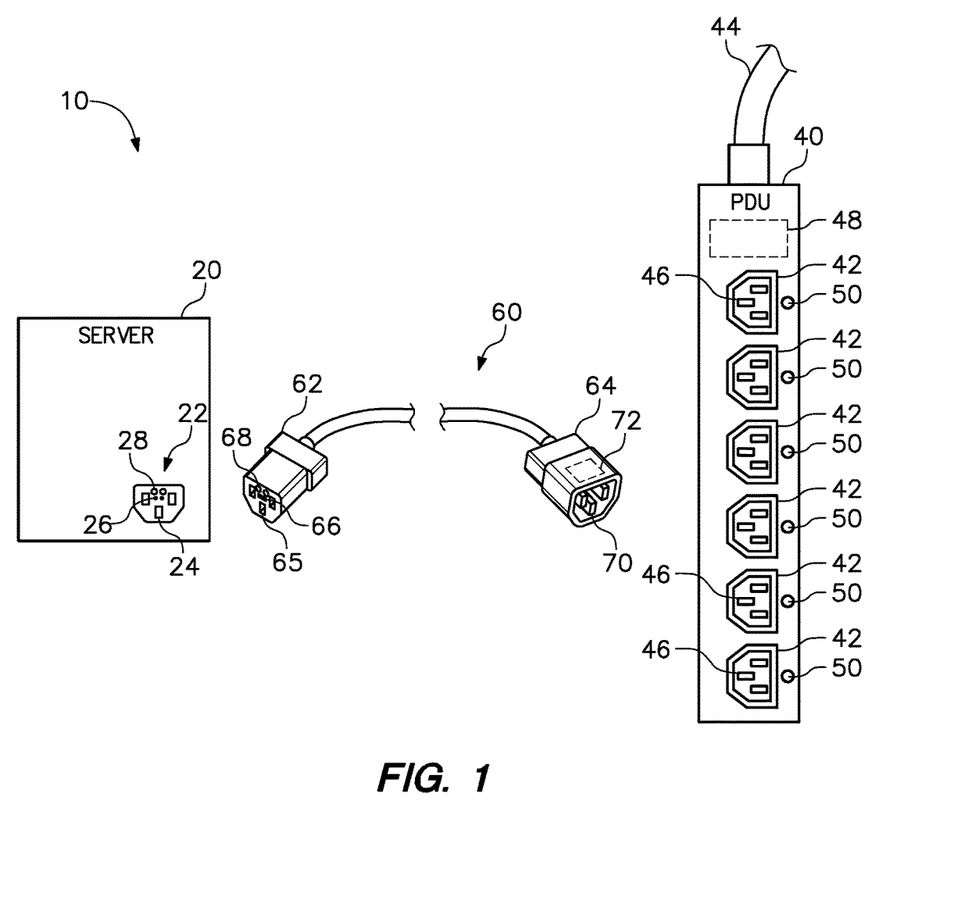
FIG. 1 is a diagram of a system including a server, a power distribution unit, and a power cable that can be used to connect the server to the power distribution unit.

FIG. 1 is a diagram of a system 10 including a server 20, a power distribution unit 40, and a power cable 60 that can be used to connect the server 20 to the power distribution unit 40. The server 20 has an external connector 22 with three prongs 24 for an AC voltage connection, a pair of contacts 26 for a cable detection circuit, and a pair of contacts 28 for extending a serial communication bus.

The power cable 60 may be interchangeably used with a variety of servers or other electronic devices and a variety of power distribution units. The power cable 60 has a first plug end 62 for selectively coupling with the external connector 22 of the server 20 and a second plug end 64 for selectively coupling with one of the outlets 42 of the power distribution unit 40. The first plug end 62 includes three receptacles 65 for engaging with the three prongs 24, a conductive strip 66 for bridging the pair of contacts 26 to close a cable detect circuit, and a pair of contacts 68 that engage the pair of contacts 28 for extending the serial communication bus. While not shown in FIG. 1, the power cable 60 includes three conductive wires for carrying AC voltage and/or ground from the three receptacles 65 at the first plug end 62 to three prongs 70 at the second plug end 64. In addition, the power cable 60 includes a pair of communication wires that extend through the power cable 60 from the pair of contacts 68 at the first plug end 62 to a read/write radio frequency identification (RFID) tag 72 at the second plug end 64.

The power distribution unit (PDU) 40 receives power from a power source through an input cable 44 and distributes that power among the six outlets 42, although the number of outlets may vary. Each outlet 42 includes receptacles 46 for engaging the prongs 70 of the second plug end 64. The power distribution unit 40 also includes a radio frequency identification tag reader 48 and a plurality of visual indicators 50, such a light-emitting diodes. As shown, the power distribution unit 40 has one visual indicator 50 adjacent each of the outlets 42, although fewer or more visual indicators may be included in one or more embodiments. For example, a single visual indicator adjacent a given outlet 42 may be in either an ON state or an OFF state to indicate that the outlet 42 CAN or CANNOT provide the server 20 with enough power to satisfy the server's power supply unit power rating. Alternatively, the PDU 40 could have two visual indicators adjacent each outlet 42 such that, for example, a green LED could be turned ON to indicate that the outlet CAN supply enough power and a red LED could be turned ON to indicate that the outlet CANNOT supply enough power.

Figure 2:
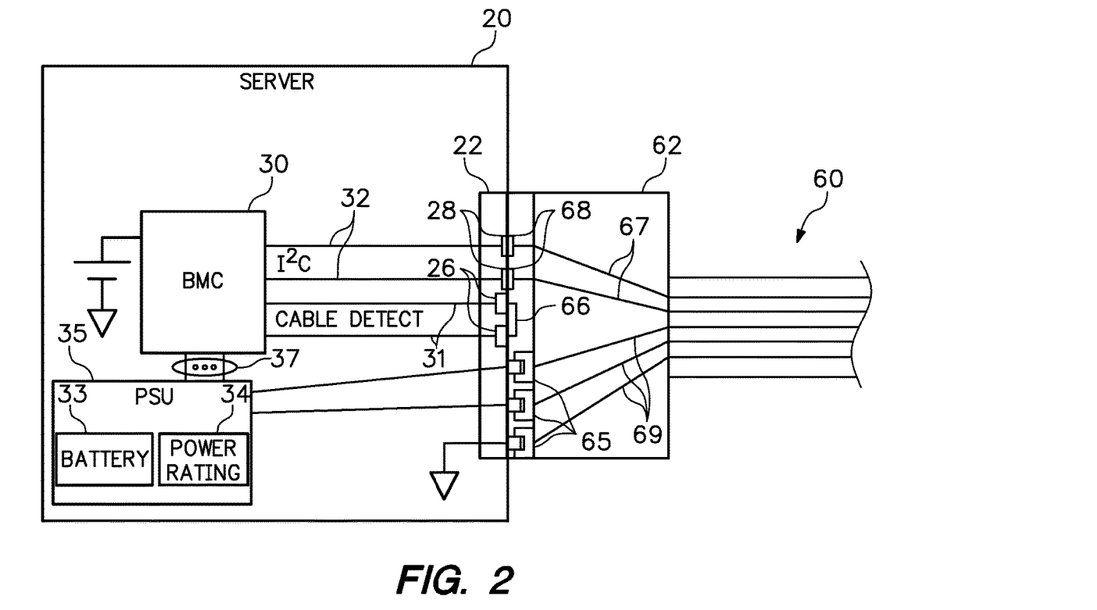
FIG. 2 is a diagram of the server coupled to a first plug of the power cable.

FIG. 2 is a diagram of the server 20 coupled to a first plug end 62 of the power cable 60. As shown, the pair of serial communication bus contacts 28 of the external connector 22 are engaged with the pair of communication wire contacts 68 of the first plug end 62. Similarly, the pair of cable detection contacts 26 of the external connector 22 are engaged with the conductive strip 66 of the first plug end 62. Furthermore, the prongs 24 of the external connector 22 are engaged with the receptacles 65 of the first plug end 62. While the prongs 24 and receptacles 65 will eventually be used to carry an AC voltage supply over the power lines 69 to the power supply unit 35, no power is supplies until the second plug end is coupled to the power distribution unit.

The server 20 includes a baseboard management controller (BMC) 30 that can detect the connection of the first plug end 62 to the external connector 22 via the cable detection lines 31 and can output a power rating to the power cable via the wires of the serial communication bus 32. The baseboard management controller 30 can receive auxiliary power from the battery 33 of the power supply unit (PSU) 35. Accordingly, the baseboard management controller 30 is able to read the power supply unit power rating 34 that may be stored in ROM on the power supply unit 35. Optionally, the power rating may be encoded to simplify communication. Such an encoded power rating may be, for example, a binary signal 37. For example, an encoded signal of "00" may be predetermined to mean a 350 watt power rating, "01" may be predetermined to mean a 500 watt power rating, "10" may be predetermined to mean a 750 watt power rating, and "11" may be predetermined to mean a 900 watt power rating. Therefore, only two binary digits are necessary to distinguish among four different power ratings. Alternatively, the power rating may be read as an exact number of watts.

Figure 3:
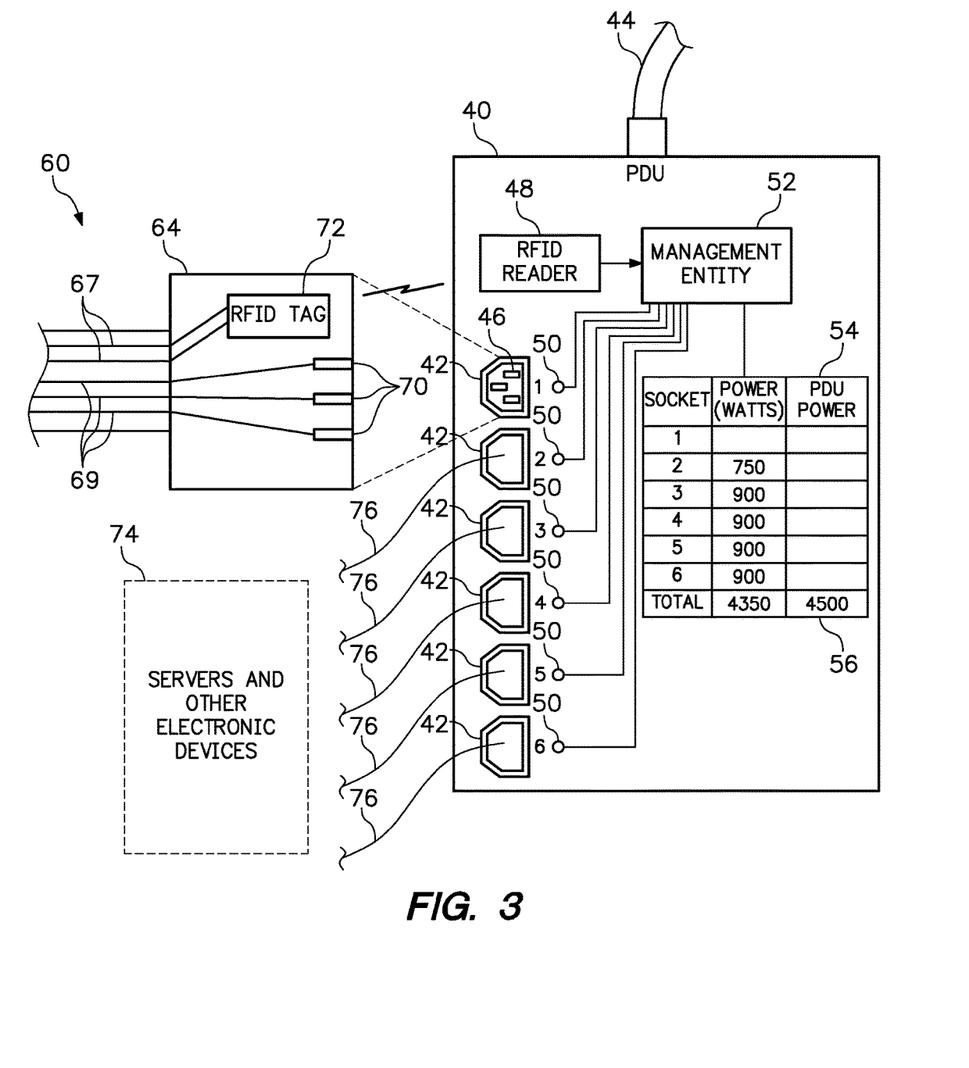
FIG. 3 is a diagram of a second plug of the power cable in proximity of the power distribution unit without being coupled to the power distribution unit.

According to various embodiments of the present invention, the baseboard management controller 30 may output the power rating on the serial communication bus ("I²C" as an example) 32 through the contacts 28, 68 and over the communication wires 67 to be written to an RFID tag 72 at the second plug end of the cable (shown in FIG. 3). In fact, the RFID tag can be written and re-written in case the cable is unplugged and used with a different server or other electronic device.

FIG. 3 is a diagram of the second plug end 64 of the power cable in proximity of the power distribution unit 40 without being coupled to the power distribution unit. The second plug end 64 includes the read/write RFID tag 72 coupled to the communication wires 67 that form an extension of the serial communication bus from the baseboard management controller. Accordingly, the read/write RFID tag 72 receives the power rating for the power supply unit 35 (shown in FIG. 2) from the baseboard management controller 30 (shown in FIG. 2). The second plug end 64 further includes the prongs 70 that will selectively engage receptacles 46 of one of the outlets 42 to supply power over the power cable 60 to the server 20 (shown in FIG. 2).

The PDU 40 includes a management entity 52 that stores power rating data, for example in a table 54 or other data structure, identifying each PDU outlet 42 and the power supply unit power rating for the electronic device connected to each PDU outlet 42. For example, the PDU outlets 42 may be identified in the table by a number, where the six outlets are numbered in numerical order (1-6) from the top to the bottom of the power distribution unit. Note that the various power supply unit power ratings are based on the Underwriters Laboratories (UL) label rating of the server, not on the actual amount of power consumed. As shown, various servers and other electronic devices 74 are already connected via power cables 76 to five of the outlets 42 (Outlets 2-6) and the power ratings of the power supply units in those devices 74 are reflected in the second column of the table 54. The management entity 52 also stores the PDU power rating 56 (for example, 4500 watts) which represents the maximum amount of power that can be supplied by the PDU 40. The management entity 52 has preferably obtained the power ratings from the other servers and other electronic devices 74 (see column 2 of table 54) in the same manner described for the server 20. Accordingly, the management entity 52 is able to calculate a total of the power ratings for devices already connected to the PDU outlets 42 (for example, 4350 watts). This allows the PDU management entity to know the remaining power available (in this example, 4500–4350=150 watts available).

When the RFID tag 72 comes into the proximity of the PDU 40, the RFID reader 48 reads the content of the RFID tag 72. If the power rating in RFID tag 72 is encoded, then the management entity 52 must decode the power rating before determining an amount of power available. Consistent with a previous example, if the RFID tag 72 contains the binary code "10" this may be interpreted to indicate a 750 watt power rating, whereas a binary code "11" may be interpreted to mean a 900 watt power rating. Regardless of whether the power rating was encoded or not, the management entity 52 may now determine whether it can supply an amount of power equal to the power rating without causing the sum of all power supply unit power ratings exceeding the PDU power rating. In the present example, if the server 20 (see FIG. 2) coupled to the power cable 60 has a power supply unit power rating of 750 watts, then the management entity 52 can determine that the sum of the power ratings for the servers and other electronic devices 74 already connected to the outlets (4350 watts) and the power rating for the proposed new server 20 (750 watts) would exceed the PDU power rating (4500 watts) by 600 watts. Accordingly, the management entity 52 may use the visual indicator 50 adjacent the available outlet 42 (Outlet #1) to indicate that the power cable 60 should NOT be coupled to the available outlet 42. Other visual indicator schemes may be implemented as described herein.

If the PDU 40 has multiple electrical phases (i.e., 3 phases) distributed among the total number of outlets (6 outlets), the management entity may perform a load balancing function by directing the user to plug in the additional electronic device to an outlet that is on a phase/circuit that is carrying less load. For example, if Outlets 1-2 are on a first phase with a phase power rating of 1500 watts (and a 750 watt server already coupled to Outlet 2), Outlets 3-4 are on a second phase with a phase power rating of 1500 watts (and a 900 watt server already coupled to Outlet 4), Outlets 5-6 are on a third phase with a phase power rating of 1500 watts (and a 900 watt server already coupled to Outlet 6), then the management entity will use a visual indicator to indicate that the new 750 watt server should be coupled to Outlet 1 since the first phase is the only phase with 750 watts of power available and Outlet 2 is already in use.

Figure 4:
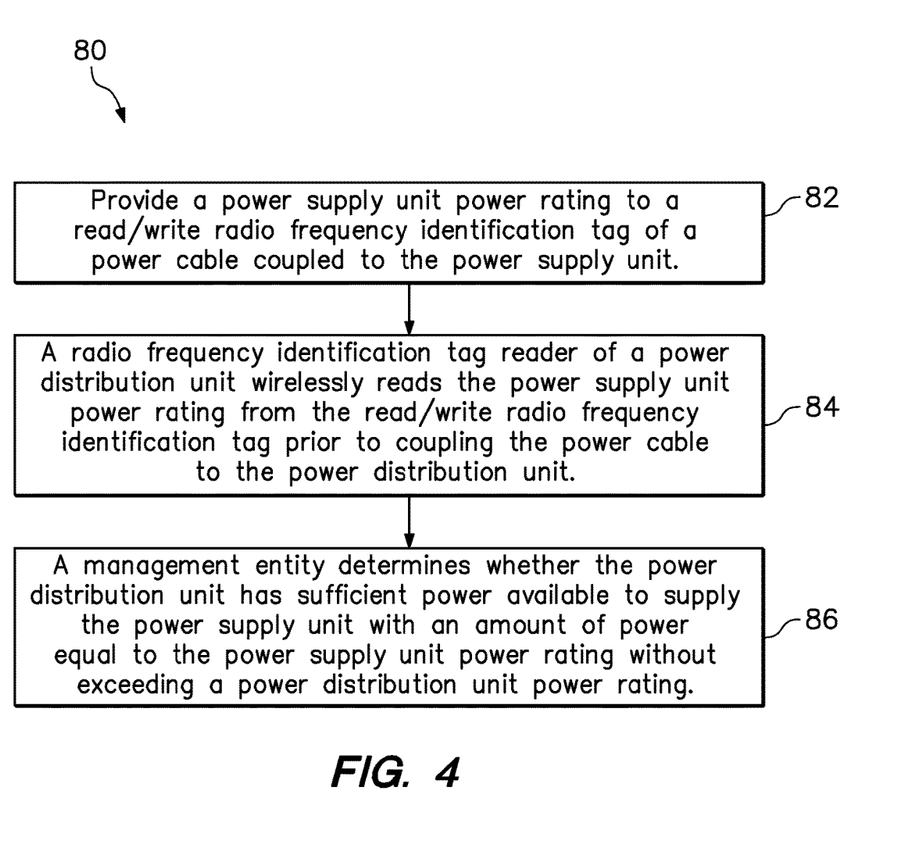
FIG. 4 is a flowchart of a method in accordance with one embodiment of the present invention.

FIG. 4 is a flowchart of a method 80 in accordance with one embodiment of the present invention. In step 82, the method provides a power supply unit power rating to a read/write radio frequency identification tag of a power cable coupled to the power supply unit. In step 84, a radio frequency identification tag reader of a power distribution unit wirelessly reads the power supply unit power rating from the read/write radio frequency identification tag prior to coupling the power cable to the power distribution unit. Then, in step 86, a management entity determines whether the power distribution unit has a sufficient power available to supply the power supply unit with an amount of power equal to the power supply unit power rating without exceeding a power distribution unit power rating.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system comprising:
an electronic device including a baseboard management controller, a power supply unit, and an external connector, wherein the baseboard management controller controls a serial communication bus, and wherein the external connector includes first contacts connected for providing AC voltage to the power supply and second contacts providing communication with the serial communication bus;
a power distribution unit including a plurality of outlets, a management entity, a radio frequency identification tag reader connected for providing input to the management entity, and at least one visual indicator controlled by the management entity;
a power cable including a first plug end for selectively coupling to the external connector of the electronic device, a second plug end for selectively coupling to one of the plurality of outlets of the power distribution unit, AC voltage wires extending from the first plug end to the second plug end, a read/write radio frequency identification tag in the second plug end, and communication wires extending from the first plug end to the read/write radio frequency identification tag, wherein coupling the first plug end to the external connector connects the AC voltage wires to the first contacts and connects the communication wires to the second contacts such that the baseboard management controller is serial communication with the read/write radio frequency identification tag.

2. The system of claim 1, wherein the power supply unit stores a power supply unit power rating and the management entity stores a power distribution unit power rating.

3. The system of claim 2, wherein the baseboard management controller sends the power supply unit power rating to the read/write radio frequency identification tag in the power cable, and wherein the radio frequency identification tag reader wirelessly reads the power supply unit power rating from the read/write radio frequency identification tag.

4. The system of claim 3, wherein the management entity obtains a power supply unit power rating for each electronic device receiving power from one of the outlets.

5. The system of claim 4, further comprising:
a visual indicator on the power distribution unit, wherein the management entity controls the visual indicator to indicate whether the power distribution unit power rating is greater than the sum of the power supply unit power ratings of each electronic device receiving power from one of the outlets and the power supply unit power rating read from the read/write radio frequency identification tag.

6. The system of claim 4, further comprising:
a plurality of visual indicators on the power distribution unit, each visual indicator positioned adjacent one of the plurality of outlets, wherein the management entity controls the plurality of visual indicators to identify one or more of the outlets where the second plug end may be coupled to provide the electronic device with power from the power distribution unit without the sum of the power supply unit power ratings of each electronic device receiving power from one of the outlets and the power supply unit power rating read from the read/write radio frequency identification tag exceeding the power distribution unit power rating.

7. The system of claim 1, wherein the plurality of outlets includes a first subset of at least two outlets supplying power from a first electrical phase, a second subset of at least two outlets supplying power from a second electrical phase, and a third subset of at least two outlets supplying power from a third electrical phase, and wherein the system further comprises:
a plurality of visual indicators on the power distribution unit, wherein one of the visual indicators is positioned adjacent each one of the plurality of outlets, wherein the management entity controls the plurality of visual indicators to identify one or more of the outlets where the second plug end may be coupled to provide the electronic device with power from the power distribution unit while achieving a greater balance of total power supply unit power ratings among the first, second and third phase.

8. The system of claim 1, further comprising:
a cable detector in communication with the baseboard management controller for detecting that the first plug end of the power cable has been coupled to the external connector.

9. The system of claim 1, wherein the serial communication bus is an inter-integrated circuit bus.

10. The system of claim 1, further comprising:
a battery providing auxiliary power to the baseboard management controller prior to the electronic device receiving AC voltage from the power distribution unit.

11. The system of claim 1, wherein the electronic device is a server.

* * * * *